(12) United States Patent
Yokoyama et al.

(10) Patent No.: US 10,771,102 B2
(45) Date of Patent: Sep. 8, 2020

(54) TRANSMIT-AND-RECEIVE MODULE AND COMMUNICATION DEVICE

(71) Applicant: Murata Manufacturing Co., Ltd., Kyoto (JP)

(72) Inventors: Jin Yokoyama, Kyoto (JP); Shiro Masumoto, Kyoto (JP); Syunji Yoshimi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 18 days.

(21) Appl. No.: 16/055,649

(22) Filed: Aug. 6, 2018

(65) Prior Publication Data

US 2020/0044681 A1 Feb. 6, 2020

(51) Int. Cl.
| | |
|---|---|
| *H04B 1/401* | (2015.01) |
| *H03H 7/40* | (2006.01) |
| *H04B 1/04* | (2006.01) |
| *H03F 3/24* | (2006.01) |

(52) U.S. Cl.
CPC .............. *H04B 1/401* (2013.01); *H03F 3/24* (2013.01); *H03H 7/40* (2013.01); *H04B 1/0458* (2013.01); *H03F 2200/294* (2013.01); *H03F 2200/451* (2013.01)

(58) Field of Classification Search
CPC ....... H03H 7/40; H03F 3/24; H03F 2200/294; H03F 2200/451; H04B 1/401; H04B 1/0458
USPC ........................................................ 333/126
See application file for complete search history.

(56) References Cited

U.S. PATENT DOCUMENTS

| 8,644,197 B2 | 2/2014 | Lee et al. |
|---|---|---|
| 9,887,727 B1 * | 2/2018 | Yokoyama ........... H04B 1/0057 |
| 2005/0077966 A1 | 4/2005 | Gresham et al. |
| 2005/0245283 A1 | 11/2005 | Boyle et al. |
| 2006/0270380 A1 | 11/2006 | Matsushima et al. |
| 2012/0146742 A1 | 6/2012 | Caron et al. |
| 2012/0208473 A1 | 8/2012 | Aparin |
| 2013/0278333 A1 | 10/2013 | Corral |
| 2014/0112213 A1 | 4/2014 | Norholm et al. |
| 2015/0028963 A1 | 1/2015 | Ebihara et al. |
| 2017/0199948 A1 | 7/2017 | Raihn et al. |

FOREIGN PATENT DOCUMENTS

| JP | 2001-53544 A | 2/2001 |
|---|---|---|
| JP | 2005-535245 A | 11/2005 |
| JP | 2006-333390 A | 12/2006 |
| JP | 2016-007022 A | 1/2016 |

* cited by examiner

*Primary Examiner* — Robert J Pascal
*Assistant Examiner* — Kimberly E Glenn
(74) *Attorney, Agent, or Firm* — Pearne & Gordon LLP

(57) ABSTRACT

A transmit-and-receive module includes a multiplexer, a power amplifier, and a low-noise amplifier. The multiplexer includes a transmit filter and a receive filter. The power amplifier and the low-noise amplifier are integrated with each other. In a Smith chart, impedance in a receive band of the receive filter seen from a receive terminal intersects a line connecting a center point of noise figure circles and a center point of gain circles. The center point of the noise figure circles represents the impedance at which the noise figure of the low-noise amplifier is minimized. The center point of the gain circles represents the impedance at which the gain of the low-noise amplifier is maximized.

11 Claims, 14 Drawing Sheets

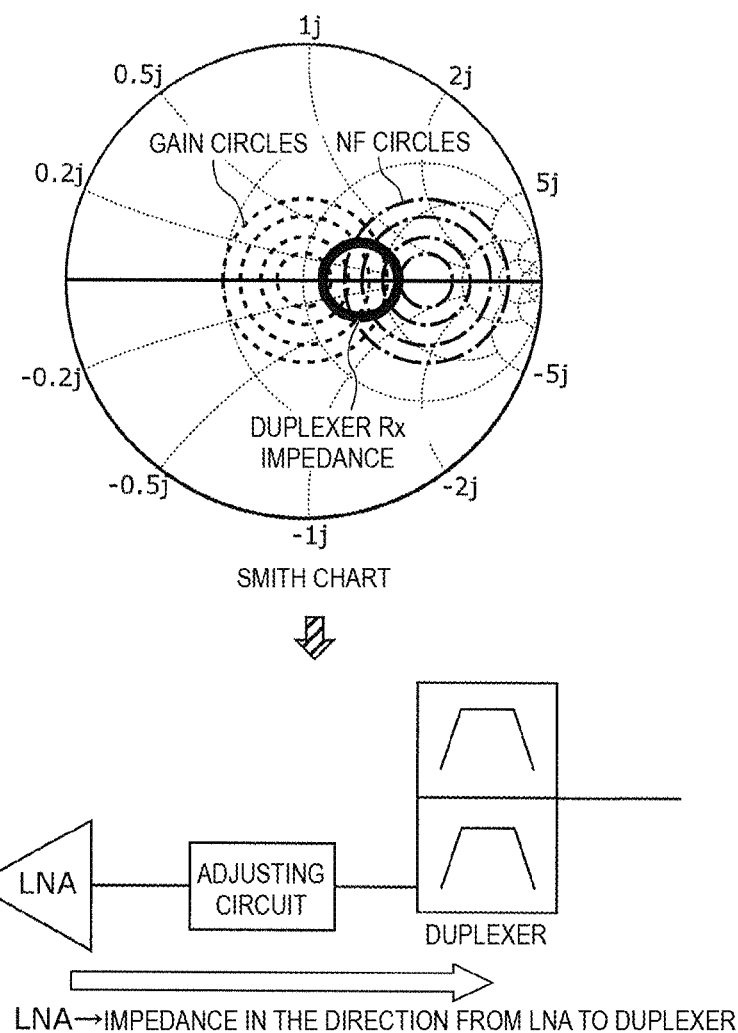

SMITH CHART

LNA→IMPEDANCE IN THE DIRECTION FROM LNA TO DUPLEXER

|  | Z1 [Ω] | Z2 [Ω] |
|---|---|---|
| FIRST EXAMPLE | 50 | 80 |
| SECOND EXAMPLE | 50 | 70 |
| THIRD EXAMPLE | 50 | 110 |
| COMPARATIVE EXAMPLE | 50 | 50 |

FIRST EXAMPLE

COMPARATIVE EXAMPLE

SECOND EXAMPLE
DUPLEXER Rx IN-BAND IMPEDANCE: 70Ω

COMPARATIVE EXAMPLE
DUPLEXER Rx IN-BAND IMPEDANCE: 50Ω

THIRD EXAMPLE
DUPLEXER Rx IN-BAND IMPEDANCE: 110Ω

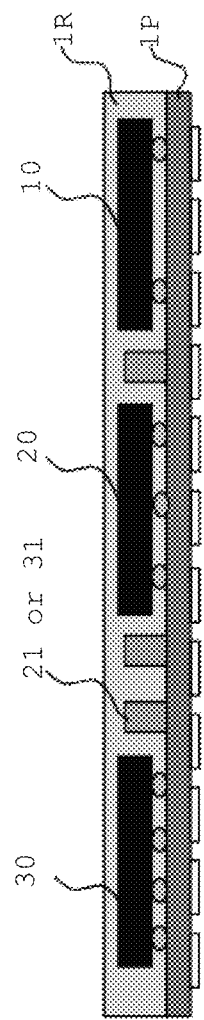
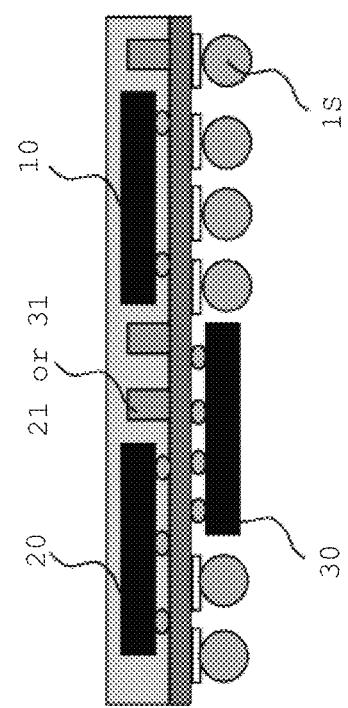
Fig.15A
Fig.15B

TRANSMIT-AND-RECEIVE MODULE AND COMMUNICATION DEVICE

BACKGROUND

The present disclosure relates to a transmit-and-receive module including a low-noise amplifier and a power amplifier and to a communication device including the transmit-and-receive module.

In accordance with a decreased size of a front-end module mounted on a mobile terminal, a transmit front-end unit, and a receive front-end unit are being integrated with each other (being formed into a module) by way of the integration of radio-frequency components.

Japanese Unexamined Patent Application Publication No. 2001-53544 discloses an antenna-integrated amplifier module including a duplexer for separating radio-frequency signals from each other according to the frequency, a low-noise amplifier, and a power amplifier (see FIG. 14 of the '544 publication).

BRIEF SUMMARY

In the above-described antenna-integrated amplifier module, impedance matching is performed so that input/output impedance of the duplexer, input impedance of the low-noise amplifier, and output impedance of the power amplifier can match the characteristic impedance (about 50Ω, for example).

In the above-described antenna-integrated amplifier module, however, the mere adjustment between the input impedance of the low-noise amplifier and the output impedance of the receive side of the duplexer by using the characteristic impedance fails to optimize the noise figure (NF) of the low-noise amplifier.

To address the above-described problem, the present disclosure provides a transmit-and-receive module which is small in size and which can decrease the noise figure while a duplexer, a power amplifier, and a low-noise amplifier are integrated with each other, and provides a communication device including the transmit-and-receive module.

According to an embodiment of the present disclosure, there is provided a transmit-and-receive module including a duplexer, a power amplifier, and a low-noise amplifier. The duplexer includes a common terminal, a transmit terminal, a receive terminal, a transmit filter unit, and a receive filter unit. A radio-frequency transmit signal and a radio-frequency received signal are input into and output from the common terminal. A radio-frequency transmit signal is input into the transmit terminal. A radio-frequency received signal is output from the receive terminal. The transmit filter unit uses a transmit band as a pass band and is connected to the common terminal and the transmit terminal. The receive filter unit uses a receive band as a pass band and is connected to the common terminal and the receive terminal. The power amplifier amplifies a radio-frequency transmit signal and outputs the amplified radio-frequency transmit signal to the transmit terminal. The low-noise amplifier amplifies a radio-frequency received signal input and received from the common terminal via the duplexer and the receive terminal. The power amplifier and the low-noise amplifier are integrated with each other. In a Smith chart, impedance in the receive band of the receive filter unit seen from the receive terminal intersects a line connecting a center point of noise figure (NF) circles and a center point of gain circles. The center point of the NF circles represents the impedance at which a noise figure of the low-noise amplifier is minimized. The center point of the gain circles represents the impedance at which gain of the low-noise amplifier is maximized.

In the related art, a low-noise amplifier handling low-power signals and a power amplifier handling high-power signals are formed in different modules. In this configuration, impedance matching between the low-noise amplifier and a duplexer is performed by using the characteristic impedance of a front-end circuit. In this case, the output impedance of a receive filter unit is set so as to maximize the gain of the low-noise amplifier. In contrast, in the above-described configuration according to an embodiment of the disclosure, the low-noise amplifier and the power amplifier are integrated with each other in the same module. To perform impedance matching between the low-noise amplifier and the duplexer, instead of using the characteristic impedance, the output impedance of the receive filter unit is set so as to optimize both of the gain and the noise figure of the low-noise amplifier. It is thus possible to provide a transmit-and-receive module which is small in size and which achieves the optimized balance of the receiving noise figure and the receiving gain while a power amplifier, a duplexer, and a low-noise amplifier are integrated with each other.

The receive filter unit may have output impedance which intersects the line connecting the center point of the NF circles and the center point of the gain circles in the Smith chart. The transmit filter unit may have input impedance at which gain of the power amplifier is maximized.

With this configuration, the input impedance of the transmit filter unit is set so as to achieve the optimized balance of the gain and the efficiency of the power amplifier, while the output impedance of the receive filter unit is set to be a value different from the characteristic impedance so that both of the gain and the noise figure of the low-noise amplifier can be optimized. This eliminates the need to provide an impedance matching circuit between the receive filter unit and the low-noise amplifier to perform impedance matching therebetween by using the characteristic impedance. It is thus possible to provide a transmit-and-receive module which is small in size and which achieves the optimized balance of the receiving noise figure and the receiving gain while a power amplifier, a duplexer, and a low-noise amplifier are integrated with each other.

A value of receive impedance used for impedance adjustment between the receive filter unit and the low-noise amplifier may be different from a value of transmit impedance used for impedance matching between the transmit filter unit and the power amplifier.

Impedance matching between the power amplifier and the duplexer is performed by using the characteristic impedance of the front-end circuit so that the balance of the gain and the efficiency of the power amplifier can be optimized. In contrast, customized impedance deviating from the characteristic impedance is used for impedance adjustment between the low-noise amplifier and the duplexer so that both of the gain and the noise figure of the low-noise amplifier can be optimized. Accordingly, the value of the receive impedance and that of the transmit impedance are different from each other. It is thus possible to enhance isolation characteristics in a path from the input terminal (module transmit terminal) of the power amplifier to the output terminal (module receive terminal) of the low-noise amplifier via the duplexer.

The value of the receive impedance used for impedance adjustment between the receive filter unit and the low-noise amplifier may be higher than the value of the transmit impedance used for impedance matching between the transmit filter unit and the power amplifier.

With this configuration, the output impedance of the receive filter unit is higher than the input impedance of the transmit filter unit. It is thus possible to enhance isolation characteristics in a path from the input terminal of the power amplifier to the output terminal of the low-noise amplifier via the duplexer.

The value of the receive impedance may be higher than the value of the transmit impedance by a factor of about 1.4 or greater.

The present inventors have found that, when the receive impedance is higher than the transmit impedance by a factor of about 1.4 or greater, it is possible to enhance the isolation while decreasing the receiving noise figure, compared with when the receive impedance is equal to the transmit impedance. That is, when the center point of NF circles of the low-noise amplifier is located on the higher impedance side than the center point of gain circles is, by setting the impedance in the receive band of the receive filter unit to be higher than the input impedance of the transmit filter unit by a factor of about 1.4 or greater, the receiving noise figure can be decreased substantially without necessarily decreasing the receiving gain. Additionally, as the difference between the output impedance of the receive filter unit and the input impedance of the transmit filter unit (characteristic impedance, for example) is greater, the isolation can be improved to a higher level.

The value of the receive impedance may be higher than the value of the transmit impedance by a factor smaller than about 2.3.

The present inventors have found that it is possible to enhance the isolation while decreasing the noise figure when the receive impedance is higher than the transmit impedance by a factor smaller than about 2.3, compared with when the receive impedance is equal to the transmit impedance. The present inventors have also found that, when the center point of NF circles of the low-noise amplifier is located on the higher impedance side than that of gain circles is, if the output impedance in the receive band of the receive filter unit is set to be higher than the input impedance in the transmit band of the transmit filter unit by a factor of about 2.3 or greater, the gain of the low-noise amplifier is significantly decreased and the noise figure thereof is also increased. When the receive impedance is higher than the transmit impedance by a factor smaller than about 2.3, the receiving noise figure can be decreased substantially without necessarily decreasing the receiving gain.

The transmit-and-receive module may further include a second duplexer, a second power amplifier, and a second low-noise amplifier. The second duplexer includes a second common terminal, a second transmit terminal, a second receive terminal, a second transmit filter unit, and a second receive filter unit. A radio-frequency transmit signal and a radio-frequency received signal are input into and output from the second common terminal. A radio-frequency transmit signal is input into the second transmit terminal. A radio-frequency received signal is output from the second receive terminal. The second transmit filter unit uses a second transmit band different from the transmit band as a pass band and is connected to the second common terminal and the second transmit terminal. The second receive filter unit uses a second receive band different from the receive band as a pass band and is connected to the second common terminal and the second receive terminal. The second power amplifier amplifies a radio-frequency transmit signal and outputs the amplified radio-frequency transmit signal to the second transmit terminal. The second low-noise amplifier amplifies a radio-frequency received signal input and received from the second common terminal via the second duplexer and the second receive terminal.

With the above-described configuration, in a multiband-support front-end circuit, impedance matching between the duplexers and the low-noise amplifiers disposed in plural signal paths connected to the antenna is performed as follows. In each signal path, instead of using the characteristic impedance, customized impedance reflecting the amplifying characteristics and the noise figure characteristics of the low-noise amplifier is used for impedance matching between the duplexer and the low-noise amplifier. It is thus possible to provide a transmit-and-receive module which is small in size and which achieves the optimized balance between the receiving noise figure and the receiving gain according to the frequency band while plural power amplifiers, plural duplexers, and plural low-noise amplifiers supporting multiple bands are integrated with each other.

According to another embodiment of the present disclosure, there is provided a communication device including the above-described transmit-and-receive module and a radio-frequency signal processing circuit. The radio-frequency signal processing circuit processes a radio-frequency received signal input from the transmit-and-receive module and processes a radio-frequency transmit signal and outputs the processed radio-frequency transmit signal to the transmit-and-receive module.

It is thus possible to provide a transmit-and-receive module which is small in size and which achieves the optimized balance of the receiving noise figure and the receiving gain while a power amplifier, a duplexer, and a low-noise amplifier are integrated with each other.

According to an embodiment of the present disclosure, it is possible to decrease the size and the noise figure of a transmit-and-receive module and a communication device in which a duplexer, a power amplifier, and a low-noise amplifier are integrated with each other.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 3A illustrates customized impedance matching for a receive filter in the first embodiment;

FIG. 15A is a structure of a communication device and transmit-and receive module according to a first embodiment.

FIG. 15B is a structure of a communication device and transmit-and receive module according to a first embodiment.

DETAILED DESCRIPTION

Figure 1:
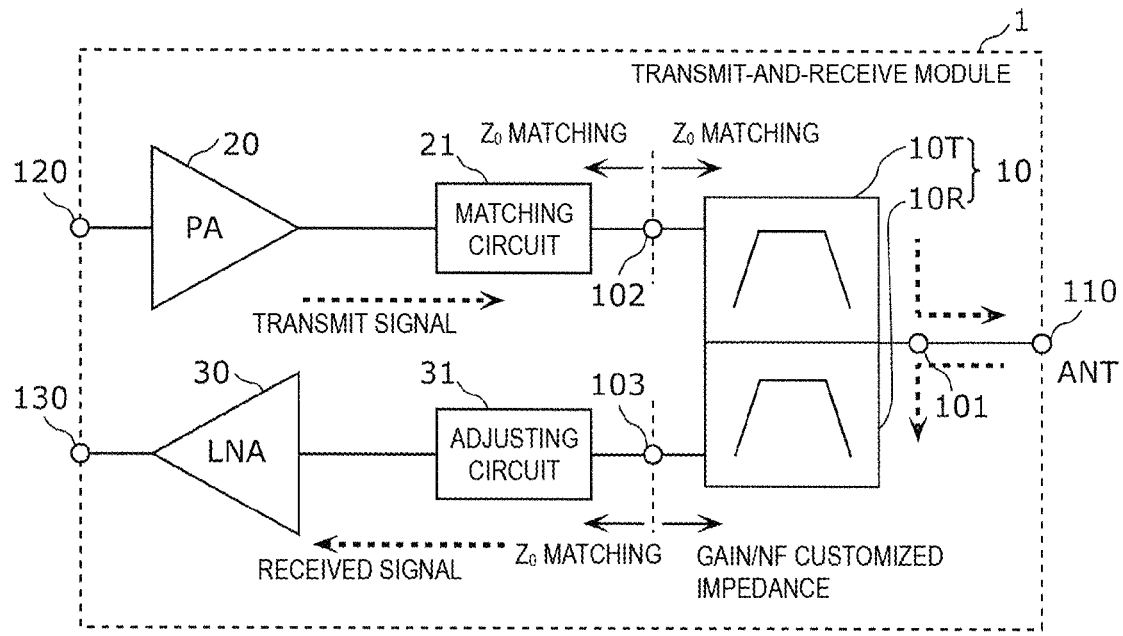
FIG. 1 is a circuit diagram of a transmit-and-receive module according to a first embodiment.

Transmit-and-receive modules and a communication device according to embodiments of the present disclosure will be described below in detail through illustration of examples with reference to the drawings. All of the embodiments described below illustrate general or specific examples. Numeric values, configurations, materials, components, and positions and connection states of the components illustrated in the following embodiments are only examples, and are not described for limiting the present disclosure. Among the components illustrated in the following embodiments, the components that are not recited in the independent claims will be described as optional components. The sizes and dimensional ratios of the components in the drawings are not necessarily illustrated as actual sizes and ratios.

First Embodiment

[1.1 Circuit Configuration of Transmit-and-Receive Module]

FIG. 1 is a circuit diagram of a transmit-and-receive module 1 according to a first embodiment. The transmit-and-receive module 1 includes a duplexer 10, a power amplifier (PA) 20, a low-noise amplifier (LNA) 30, a matching circuit 21, an adjusting circuit 31, a module common terminal 110, a module transmit terminal 120, and a module receive terminal 130.

The duplexer 10 includes a common terminal 101, a transmit terminal 102, a receive terminal 103, a transmit filter 10T, and a receive filter 10R. With this configuration, the duplexer 10 is able to simultaneously pass a radio-frequency (RF) transmit signal in a transmit band from the transmit terminal 102 to the common terminal 101 and a RF received signal in a receive band from the common terminal 101 to the receive terminal 103 by using the frequency-division duplexing (FDD) method.

The common terminal 101 is connected to the module common terminal 110. The duplexer 10 transmits a RF transmit signal and receives a RF received signal through the common terminal 101. The transmit terminal 102 is a terminal into which a RF transmit signal is input via the module transmit terminal 120, the power amplifier 20, and the matching circuit 21. The receive terminal 103 is a terminal from which a RF received signal is output via the module common terminal 110, the common terminal 101, and the receive filter 10R.

The transmit filter 10T is a transmit filter unit using a transmit band as a pass band and being connected to the common terminal 101 and the transmit terminal 102. The receive filter 10R is a receive filter unit using a receive band as a pass band and being connected to the common terminal 101 and the receive terminal 103.

The power amplifier 20 is a power amplifier circuit that amplifies a RF transmit signal input from the module transmit terminal 120 and outputs the amplified RF transmit signal to the transmit terminal 102 via the matching circuit 21.

The low-noise amplifier 30 is a low-noise amplifier circuit that amplifies a RF received signal input from the module common terminal 110 via the receive filter 10R and the adjusting circuit 31.

The matching circuit 21 is a circuit for providing impedance matching between the power amplifier 20 and the transmit filter 10T. The matching circuit 21 provides impedance matching so that the impedance of the power amplifier 20 seen from the transmit terminal 102 can match the characteristic impedance (about 50Ω, for example).

The adjusting circuit 31 is a circuit for adjusting the input impedance of the low-noise amplifier 30. The adjusting circuit 31 adjusts the impedance of the low-noise amplifier 30 seen from the receive terminal 103 to the characteristic impedance (about 50Ω, for example).

In the transmit-and-receive module 1 according to the first embodiment, the provision of the matching circuit 21 and the adjusting circuit 31 may be omitted.

The module common terminal 110 is an external connecting terminal that can be connected to a communication medium, such as an antenna. The module transmit terminal 120 is an external connecting terminal for connecting the power amplifier 20 and a RF signal processing circuit (RF integrated circuit (RFIC)) (not shown) disposed subsequent to the power amplifier 20. The module receive terminal 130 is an external connecting terminal for connecting the low-noise amplifier 30 and the RFIC (not shown).

To reduce the size of the transmit-and-receive module 1, the power amplifier 20 handling high-power signals and the low-noise amplifier 30 handling low-power signals are integrated with each other. In the first embodiment, integrating of the power amplifier 20 and the low-noise amplifier 30 with each other is not restricted to forming of the power amplifier 20 and the low-noise amplifier 30 into one chip. An amplifier element forming the power amplifier 20 and an amplifier element forming the low-noise amplifier 30 may be made separately and be formed in the same package or be mounted on the same mounting substrate. Such a configuration is also included in integrating of the power amplifier 20 and the low-noise amplifier 30 with each other.

[1.2 Circuit Configuration of Transmit-and-Receive Module According to Comparative Example]

In some transmit-and-receive modules of the related art, a transmit module handling high-power signals and a receive module handling low-power signals are not integrated with each other.

Figure 2:
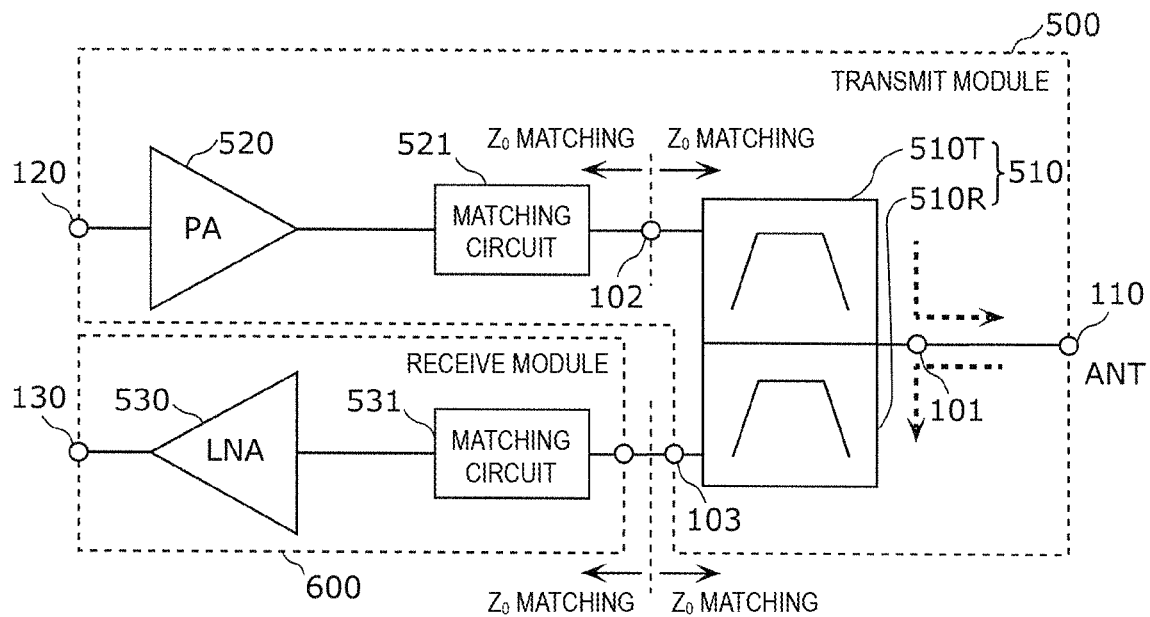
FIG. 2 is a circuit diagram of a transmit-and-receive module according to a comparative example.

FIG. 2 is a circuit diagram of a transmit-and-receive module according to a comparative example. As shown in FIG. 2, this transmit-and-receive module is constituted by a transmit module 500 and a receive module 600. That is, unlike the transmit-and-receive module 1 according to the first embodiment, in the transmit-and-receive module of the comparative example, the transmit module 500 and the receive module 600 are formed as different chips and are not integrated with each other. The transmit-and-receive module of the comparative example is also different from the transmit-and-receive module 1 in the mode of impedance matching between a receive filter 510R and the receive module 600.

[1.3 Comparison of Impedance Matching Between First Embodiment and Comparative Example]

Figure 3B:
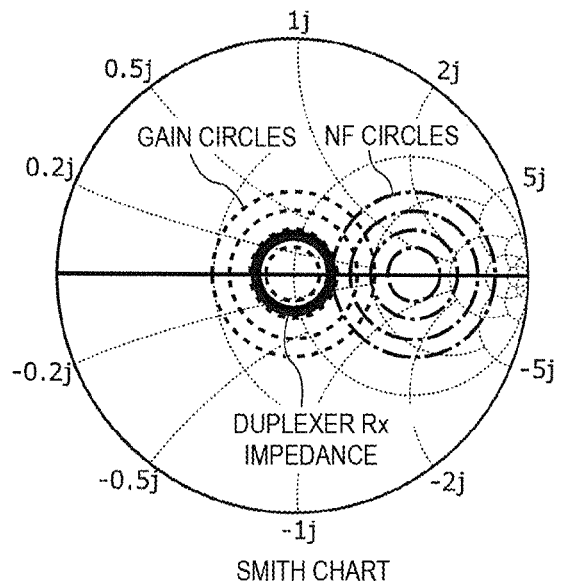
FIG. 3B illustrates characteristic impedance (about 50Ω) matching for a receive filter in the comparative example.
Figure 3B:
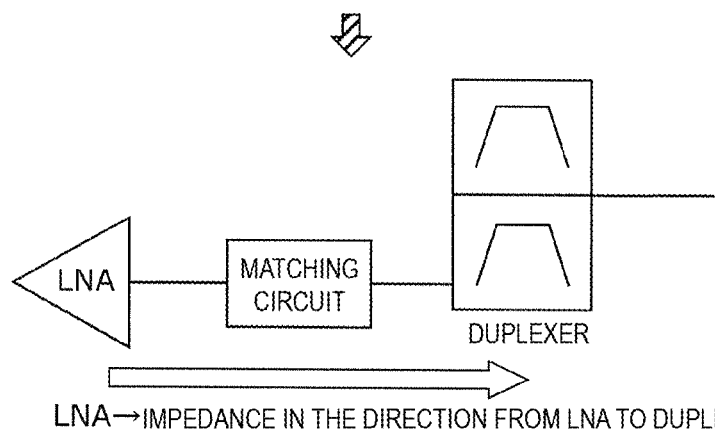

FIG. 3A illustrates customized impedance matching for the receive filter 10R in the first embodiment. FIG. 3B illustrates characteristic impedance (about 50Ω) matching for the receive filter 510R in the comparative example.

In the transmit-and-receive module shown in FIG. 2 in which the transmit module 500 handling high-power signals and the receive module 600 handling low-power signals are separately formed, impedance matching between a low-noise amplifier 530 and the receive filter 510R of a duplexer 510 is performed by using the characteristic impedance (about 50Ω, for example) of a front-end circuit. In the transmit-and-receive module of the comparative example, as shown in FIG. 3B, to maximize the gain of the low-noise amplifier 530, a matching circuit 531 adjusts the impedance of the low-noise amplifier 530 so that the center point of gain circles (equal gain circles) of the low-noise amplifier 530 can be the characteristic impedance (about 50Ω). To maximize the gain of the low-noise amplifier 530, the output impedance of the receive filter 510R is set so that it can coincide with the center point (characteristic impedance) of the gain circles, as shown in FIG. 3B.

In contrast, in the transmit-and-receive module 1 of the first embodiment, the low-noise amplifier 30 and the power amplifier 20 are integrated with each other. Instead of performing impedance matching between the low-noise amplifier 30 and receive filter 10R by using the characteristic impedance (about 50Ω) of the front-end circuit, the impedance of the receive filter 10R is set so as to increase the gain of the low-noise amplifier 30 and to decrease the noise figure (NF) thereof. That is, in the transmit-and-receive module 1 of the first embodiment, instead of maximizing the gain of the low-noise amplifier 30, the impedance of the receive filter 10R is set so as to optimize both of the gain and the noise figure of the low-noise amplifier 30. More specifically, in the Smith chart shown in FIG. 3A, the output impedance of the receive filter 10R is set so that the impedance in the receive band of the receive filter 10R seen from the receive terminal 103 can intersect a line connecting the center point of the NF circles and that of the gain circles.

The impedance, the NF circles, and the gain circles in the receive path of the first embodiment and those of the comparative example are based on the direction in which the receive filter is seen from the low-noise amplifier, as indicated in the lower sections of FIGS. 3A and 3B. The NF circle (equal NF circle) represents the output impedance of the receive filter at which the noise figure of the low-noise amplifier 30 including the adjusting circuit 31 is equal. The gain circle (equal gain circle) represents the output impedance of the receive filter at which the gain of the low-noise amplifier 30 including the adjusting circuit 31 is equal. The center point of the NF circles represents the output impedance in the receive band of the receive filter at which the noise figure of the low-noise amplifier 30 including the adjusting circuit 31 is minimized. The center point of the gain circles represents the output impedance in the receive band of the receive filter at which the gain of the low-noise amplifier 30 including the adjusting circuit 31 is maximized.

With the configuration of the transmit-and-receive module 1 of the first embodiment, it is possible to provide a transmit-and-receive module which is small in size and which achieves the optimized balance of the receiving noise figure and the receiving gain while a power amplifier, a duplexer, and a low-noise amplifier are integrated with each other.

[1.4 Characteristics Comparison of Transmit-and-Receive Modules According to Examples and Comparative Example]

Figure 4:
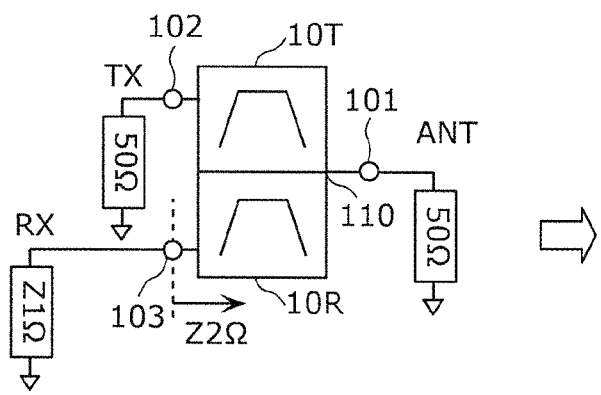
FIG. 4 illustrates the impedance of receive filters in transmit-and-receive modules according to first through third examples and a comparative example.

FIG. 4 illustrates the impedance of receive filters in transmit-and-receive modules according to first through third examples and a comparative example. FIG. 4 shows that the impedance of the low-noise amplifier seen from the receive terminal 103 is Z1 (Ω), the impedance of the receive filter seen from the receive terminal 103 is Z2 (Ω), and the impedance of the other elements (the impedance of the power amplifier seen from the transmit terminal 102 and the impedance of the antenna seen from the common terminal 101) is all about 50Ω.

The table on the right side in FIG. 4 shows that Z2 of a transmit-and-receive module of a first example is about 80Ω, that of a second example is about 70Ω, and that of a third example is about 110Ω. Z1 of the transmit-and-receive modules of the first through third examples and that of the comparative example are all about 50Ω.

Figure 5A:
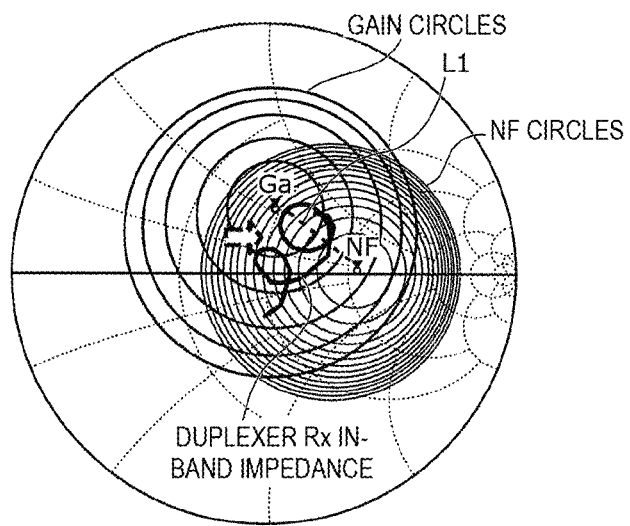
FIG. 5A is a Smith chart illustrating the relationship of the in-band impedance of the receive filter to NF circles and gain circles in the first example.
Figure 5B:
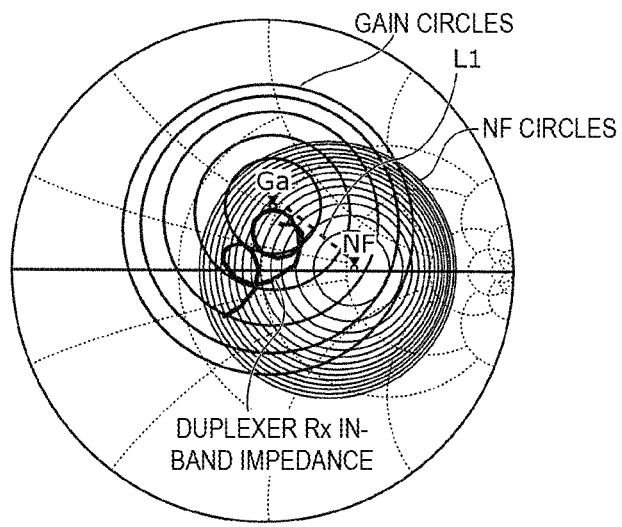
FIG. 5B is a Smith chart illustrating the relationship of the in-band impedance of the receive filter to NF circles and gain circles in the comparative example.

FIG. 5A is a Smith chart illustrating the relationship of the in-band output impedance of the receive filter 10R to NF circles and gain circles in the first example. FIG. 5B is a Smith chart illustrating the relationship of the in-band output impedance of the receive filter to NF circles and gain circles in the comparative example.

Concerning the transmit-and-receive module of the comparative example in which the transmit module 500 and the receive module 600 are separately disposed, the Smith chart in FIG. 5B shows that the impedance in the receive band of the receive filter 510R seen from the receive terminal 103 (duplexer Rx in-band impedance in FIG. 5B) does not intersect a line (L1 in FIG. 5B) connecting the center point (NF in FIG. 5B) of the NF circles and that (Ga in FIG. 5B) of the gain circles. The impedance in the receive band of the receive filter 510R is located at the center (characteristic impedance) of the Smith chart.

In contrast, concerning the transmit-and-receive module 1 of the first example, the Smith chart in FIG. 5A shows that the impedance in the receive band of the receive filter 10R seen from the receive terminal 103 (duplexer Rx in-band impedance in FIG. 5A) intersects a line (L1 in FIG. 5A) connecting the center point (NF in FIG. 5A) of the NF circles and that (Ga in FIG. 5A) of the gain circles. As a result, the impedance of the receive filter 10R of the first example is separated farther from the center (characteristic impedance) of the Smith chart and is shifted toward the higher impedance side, and is thus located closer to the center point of the NF circles than that of the receive filter 510R of the comparative example is.

Figure 6:
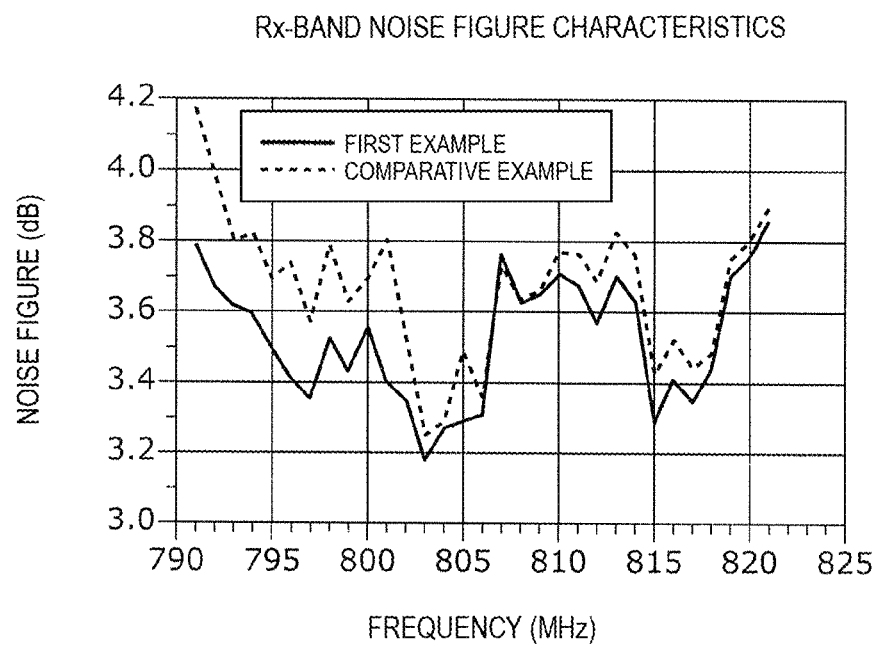
FIG. 6 is a graph illustrating comparison results of the noise figure of the transmit-and-receive module of the first example and that of the comparative example.

FIG. 6 is a graph illustrating comparison results of the noise figure of the transmit-and-receive module 1 of the first example and that of the comparative example. More specifically, this graph illustrates comparison results of the noise figure in the receive band between the module common terminal 110 and the module receive terminal 130 of the first example and that of the comparative example. As a result of shifting the output impedance of the receive filter 10R of the transmit-and-receive module 1 of the first example toward the center point of the NF circles, as shown in FIG. 5A, the noise figure is decreased in the entire receive band by about 0 to 0.4 dB compared with that of the transmit-and-receive module of the comparative example.

With the above-described configuration of the transmit-and-receive module 1 of the first example, it is possible to decrease the receiving noise figure while the power amplifier 20, the duplexer 10, and the low-noise amplifier 30 are integrated with each other.

To form a small transmit-and-receive module by integrating a power amplifier and a low-noise amplifier with each other, the performance of circuit elements such as an inductor and a capacitor used for an adjusting circuit 31 is sacrificed. This may reduce the Q factor of the adjusting circuit 31, which may lead to an increase in the receiving noise figure of the transmit-and-receive module. However, in the transmit-and-receive module 1 of the first embodiment, instead of maximizing the gain of the low-noise amplifier 30, impedance adjustment is performed so as to achieve the optimized balance of the noise figure and the gain. This makes it possible to reduce the size of the transmit-and-receive module 1 without necessarily sacrificing the receiving performance even with a decrease in the Q factor of the adjusting circuit 31.

The transmit-and-receive isolation characteristics and the transmission characteristics in the receive path of the transmit-and-receive modules will now be described below.

Figure 7A:
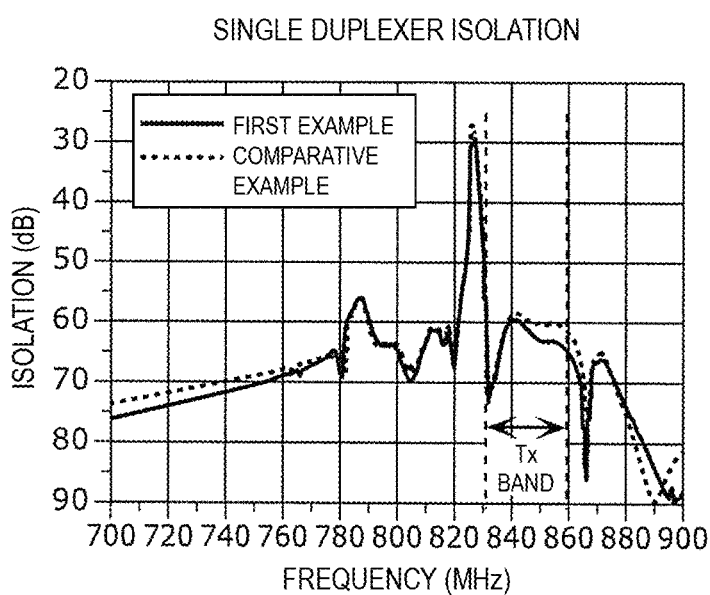
FIG. 7A is a graph illustrating comparison results of isolation characteristics of a single duplexer of the first example and those of the comparative example.

FIG. 7A is a graph illustrating comparison results of the isolation characteristics of a single duplexer of the first example and those of the comparative example. More specifically, this graph illustrates isolation characteristics of a single duplexer between the transmit terminal 102 and the receive terminal 103 of the first example and those of the comparative example. FIG. 7A shows that the isolation characteristics of the transmit-and-receive module 1 of the first example are improved particularly in the transmit band, compared with the comparative example.

In the transmit-and-receive module 1 of the first example, the receive impedance used for impedance adjustment between the receive filter 10R and the low-noise amplifier 30 is about 80Ω. The receive impedance used for impedance adjustment between the receive filter 10R and the low-noise amplifier 30 is the output impedance in the receive band of the receive filter 10R to optimize the balance between the noise figure and the gain of the low-noise amplifier 30. The transmit impedance used for impedance matching between the transmit filter 10T and the power amplifier 20 is set so that the input impedance of the transmit filter 10T can achieve the optimized gain and efficiency of the power amplifier 20, and more specifically, the input impedance of the transmit filter 10T is set to be about 50Ω. The transmit impedance used for impedance matching between the transmit filter 10T and the power amplifier 20 is, for example, the input impedance in the transmit band of the transmit filter 10T for causing the transmit impedance to match the impedance of the matching circuit 21.

That is, in the transmit-and-receive module 1 of the first example, the value of the receive impedance and that of the transmit impedance are different. More particularly, in the first example, the value of the receive impedance is higher than that of the transmit impedance. The isolation characteristics are thus improved, as shown in FIG. 7A, because of the difference in the impedance between the transmit path and the receive path in the signal path from the transmit terminal 102 to the receive terminal 103.

Figure 7B:
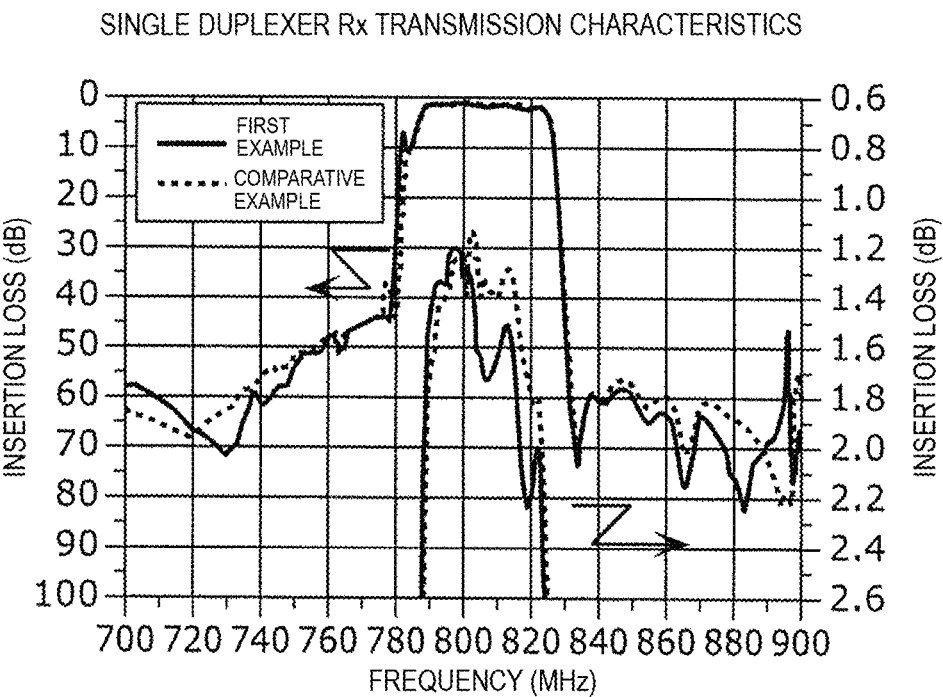
FIG. 7B is a graph illustrating comparison results of receive-band transmission characteristics of a single duplexer of the first example and those of the comparative example.

FIG. 7B is a graph illustrating comparison results of receive-band transmission characteristics of a single duplexer of the first example and those of the comparative example. More specifically, this graph illustrates transmission characteristics of a single duplexer (receive filter) between the common terminal 101 and the receive terminal 103 of the first example and those of the comparative example. FIG. 7B shows that the insertion loss in the receive band of the transmit-and-receive module 1 of the first example is increased, compared with the comparative example. The reason for this is that the receive impedance in the first example deviates from the characteristic impedance which is about 50Ω, and this makes the in-band transmission characteristics appear to be decreased. However, the transmission characteristics in the path between the module common terminal 110 and the module receive terminal 130 including the low-noise amplifier 30, the adjusting circuit 31, and the duplexer 10 are maintained, which will be discussed later in detail with reference to FIG. 9B.

The relationship between the above-described receive impedance and the isolation characteristics will be described below.

Figure 8A:
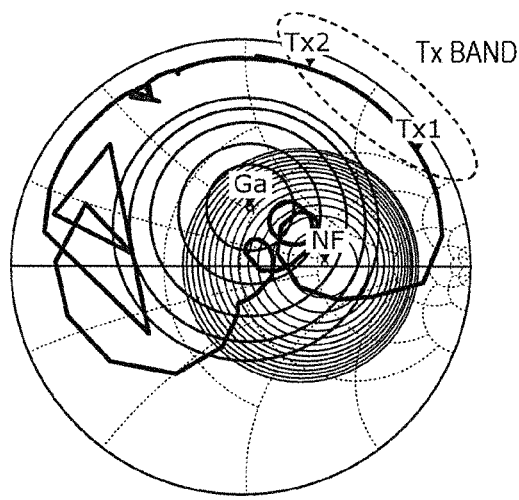
FIG. 8A is a Smith chart illustrating the relationship of the impedance of the receive filter to NF circles and gain circles in the first example.
Figure 8B:
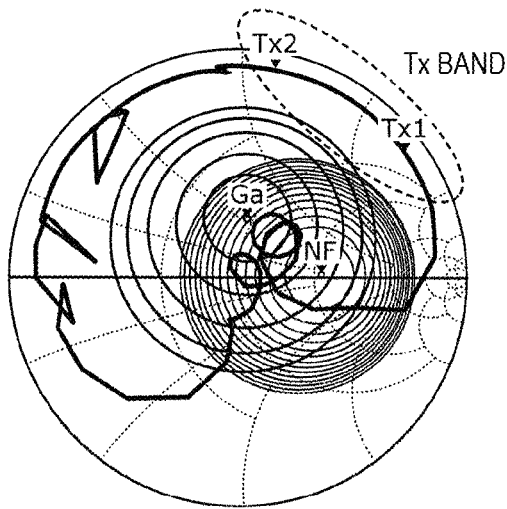
FIG. 8B is a Smith chart illustrating the relationship of the impedance of the receive filter to NF circles and gain circles in the second example.
Figure 8C:
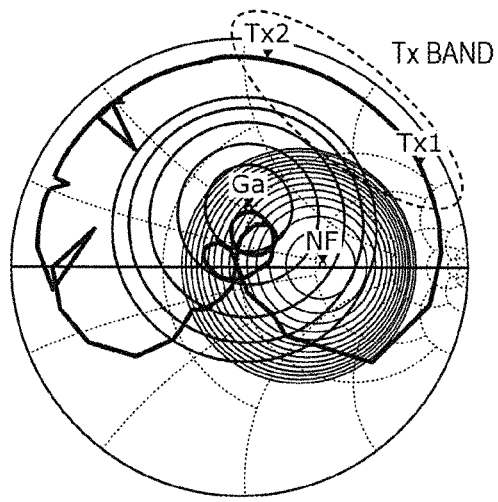
FIG. 8C is a Smith chart illustrating the relationship of the impedance of the receive filter to NF circles and gain circles in the comparative example.

FIG. 8A is a Smith chart illustrating the relationship of the output impedance of the receive filter 10R to NF circles and gain circles in the first example. FIG. 8B is a Smith chart illustrating the relationship of the output impedance of the receive filter 10R to NF circles and gain circles in the second example. FIG. 8C is a Smith chart illustrating the relationship of the output impedance of the receive filter 510R to NF circles and gain circles in the comparative example.

FIG. 8A illustrates out-of-band impedance characteristics of the receive filter 10R in addition to the impedance characteristics of the transmit-and-receive module 1 (Z2=about 80Ω) according to the first example shown in FIG. 5A. FIG. 8B illustrates the impedance characteristics of the receive filter 10R of the transmit-and-receive module 1 (Z2=about 70Ω) according to the second example. FIG. 8C illustrates out-of-band impedance characteristics of the receive filter 510R in addition to the impedance characteristics of the transmit-and-receive module (Z2=about 50Ω) according to the comparative example shown in FIG. 5B.

As shown in FIGS. 8A through 8C, as the receive impedance Z2 increases such as about 50Ω (comparative example), about 70Ω (second example), and about 80Ω (first example), the receive-band output impedance of the receive filter approaches closer to the center point (NF) of the NF circles from the center point (Ga) of the gain circles. Additionally, the transmit-band impedance (Tx1-Tx2 in FIGS. 8A through 8C) of the receive filter varies in accordance with a change in the receive impedance Z2. More specifically, impedance $Z_0$ of the receive filter 10R of the first example corresponding to Tx2 (862 MHz) is $Z_0$(0.114+j1.400) (=70.2Ω) ). Impedance $Z_0$ of the receive filter 10R of the second example corresponding to Tx2 (862 MHz) is $Z_0$(0.098+j1.196) (=60.0Ω). Impedance $Z_0$ of the receive filter 510R of the comparative example corresponding to Tx2 (862 MHz) is $Z_0$(0.096+j1.146) (=57.5Ω). This shows that, as the receive impedance Z2 increases, the output impedance in the transmit band of the receive filter separates farther from the characteristic impedance (about 50Ω) and farther from the center point (Ga) of the gain circles. That is, as the impedance of the receive filter 10R is shifted toward the higher impedance side, the transmit-band impedance can separate farther from the center point of the gain circles. This reduces the gain in the transmit band of the receive filter 10R, thereby making it possible to enhance the transmit-and-receive isolation characteristics.

Figure 9A:
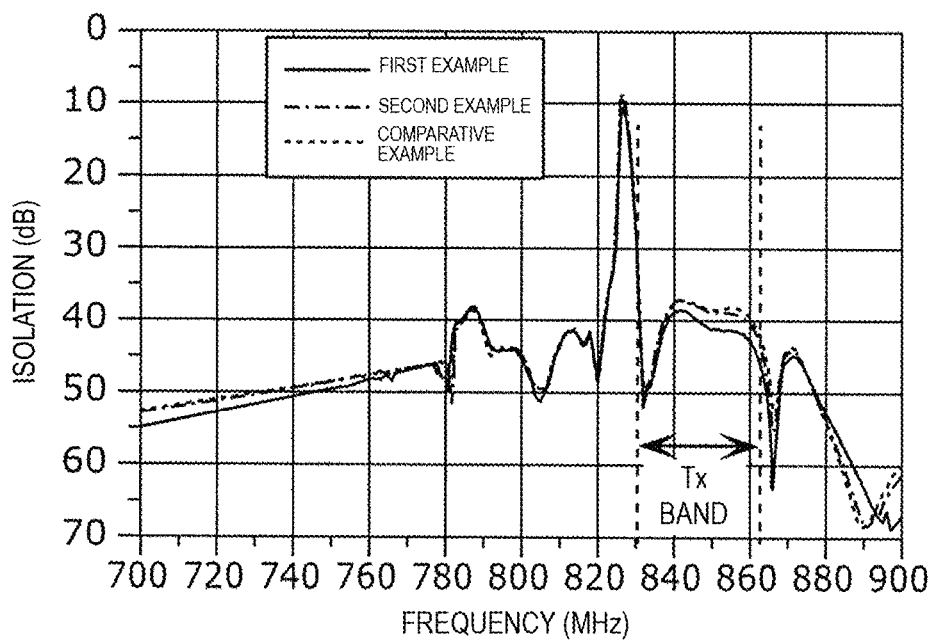
FIG. 9A is a graph illustrating comparison results of the isolation between power amplifiers and low-noise amplifiers according to the first example, the second example, and the comparative example.

FIG. 9A is a graph illustrating comparison results of the isolation between the power amplifiers and the low-noise amplifiers according to the first example, the second example, and the comparative example. This graph illustrates the isolation characteristics (PA-LNA isolation) between the module transmit terminal 120 and the module receive terminal 130. FIG. 9A shows that the isolation, particularly in the transmit-band isolation, of the transmit-and-receive module 1 of each of the first and second examples is improved, compared with the transmit-and-receive module of the comparative example. The isolation of the transmit-and-receive module 1 in the first example is improved to a higher level than that of the second example. This validates that the transmit-and-receive isolation characteristics are improved to a higher level as the difference between the receive impedance (output impedance of the receive filter 10R) used for impedance adjustment between the receive filter 10R and the low-noise amplifier 30 and the transmit impedance (input impedance of the transmit filter 10T) used for impedance matching between the transmit filter 10T and the power amplifier 20 is greater.

Figure 9B:
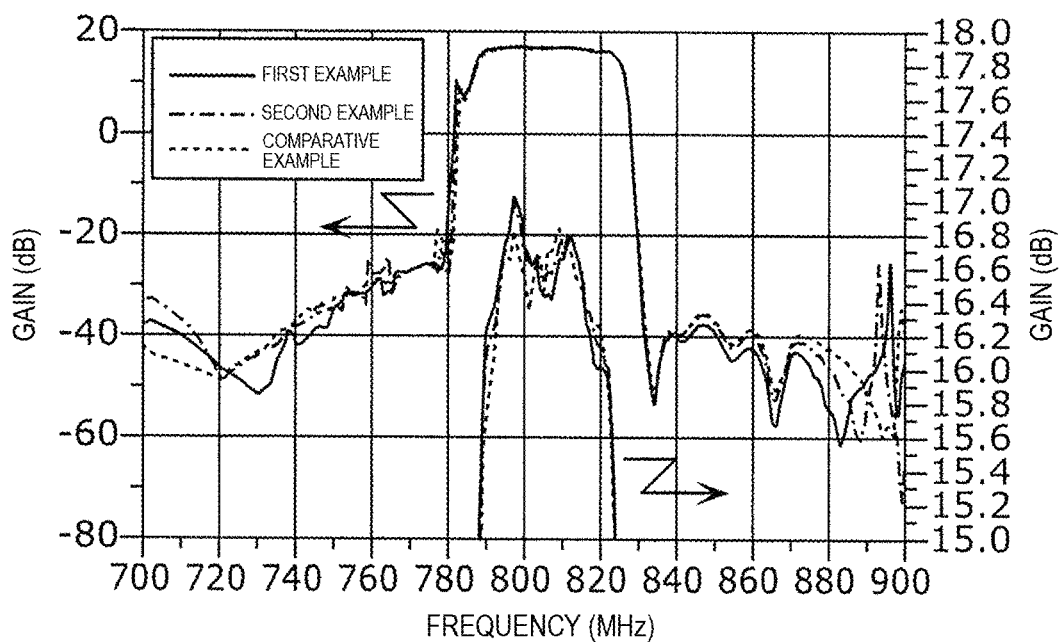
FIG. 9B is a graph illustrating comparison results of receive-band transmission characteristics between duplexers and the low-noise amplifiers according to the first example, the second example, and the comparative example.

FIG. 9B is a graph illustrating comparison results of the receive-band transmission characteristics between the duplexers and the low-noise amplifiers according to the first example, the second example, and the comparative example. This graph illustrates the transmission characteristics (DupRx-LNA transmission characteristics) between the module common terminal 110 and the module receive terminal 130. FIG. 9B shows that, even with a difference between the receive impedance and the transmit impedance, the transmission characteristics in the receive path do not deteriorate, but are maintained, compared with the comparative example in which the receive impedance and the transmit impedance match the characteristic impedance (about 50Ω).

That is, as shown in FIGS. 8A through 8C, by reducing the gain of the transmit band in the receive path as a result of separating the transmit-band impedance of the receive filter 10R farther from the gain circles, the transmit-and-receive isolation characteristics can be improved while maintaining the transmission characteristics of the receive band.

The above-described comparison results of the first and second examples and the comparative example show that, when the transmit impedance is about 50Ω, the receive impedance can be 70Ω or higher. That is, the receive impedance can be higher than the transmit impedance by a factor of about 1.4 or greater.

The present inventors have found that, when the receive impedance is higher than the transmit impedance by a factor of about 1.4 or greater, as in the second example, it is possible to enhance the isolation while decreasing the receiving noise figure, compared with when the receive impedance is equal to the transmit impedance. That is, when the center point of NF circles of the low-noise amplifier is located on the higher impedance side than the center point of gain circles is, by setting the impedance in the receive band of the receive filter 10R to be higher than the input impedance of the transmit filter 10T by a factor of about 1.4 or greater, the receiving noise figure can be decreased substantially without necessarily decreasing the receiving gain. Additionally, as the difference between the output impedance of the receive filter 10R and the input impedance of the transmit filter 10T (characteristic impedance, for example) is greater, the isolation can be improved to a higher level.

Figure 10A:
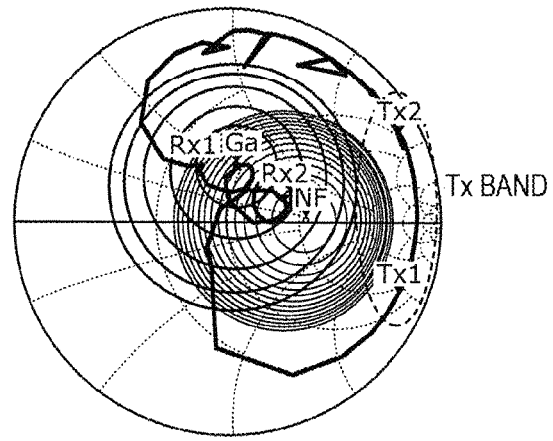
FIG. 10A is a Smith chart illustrating the relationship of the impedance of the receive filter to NF circles and gain circles in the third example.

FIG. 10A is a Smith chart illustrating the relationship of the output impedance of the receive filter 10R to NF circles and gain circles in the third example.

FIG. 10A illustrates the impedance characteristics of the receive filter 10R of the transmit-and-receive module 1 (Z2=about 110Ω) according to the third example. As shown in FIG. 10A, when the receive impedance Z2 is about 110Ω, the receive-band impedance (Rx1 to Rx2 in FIG. 10A) of the receive filter 10R approaches even closer to the center point (NF) of the NF circles from the center point (Ga) of the gain circles than that of the first and second examples. In accordance with the increased receive impedance Z2, the transmit-band impedance (Tx1 to Tx2 in FIG. 10A) of the receive filter is farther shifted to the higher impedance side than that of the first and second examples. This makes it possible to further enhance the transmit-and-receive isolation characteristics to a higher level than those of the first and second examples. The noise figure can also be decreased to be smaller than that of the first and second example, and can be reduced to a minimal level.

Figure 10B:
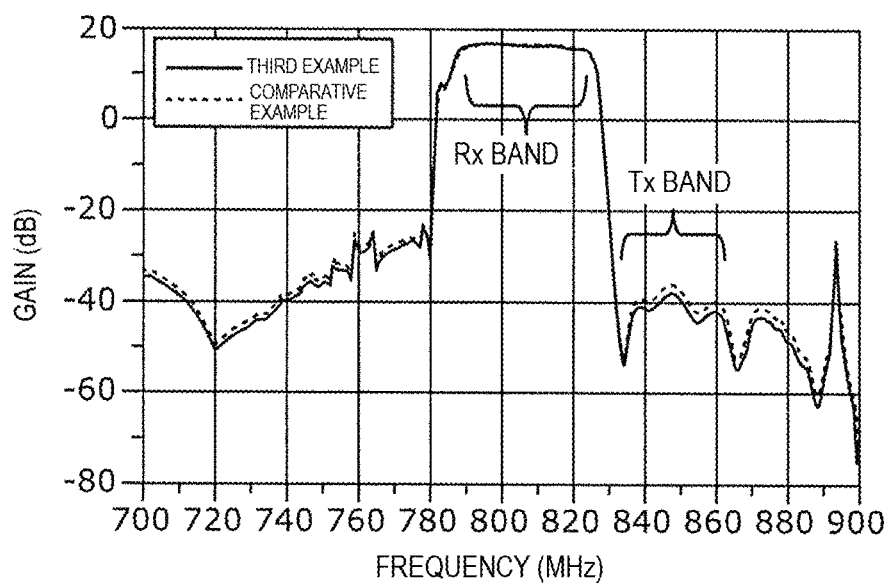
FIG. 10B is a graph illustrating comparison results of receive-band transmission characteristics between the duplexers and the low-noise amplifiers according to the third example and the comparative example.

FIG. 10B is a graph illustrating comparison results of the receive-band transmission characteristics between the duplexers and the low-noise amplifiers according to the third example and the comparative example. This graph illustrates the transmission characteristics (DupRx-LNA transmission characteristics) between the module common terminal 110 and the module receive terminal 130. FIG. 10B shows that, when the receive impedance is about 110Ω, the transmission characteristics are less likely to deteriorate than in the comparative example in which the receive impedance and the transmit impedance match the characteristic impedance (about 50Ω). That is, as shown in FIGS. 10A and 10B, by reducing the gain of the transmit band in the receive path as a result of separating the transmit-band impedance of the receive filter 10R even farther from the gain circles, the transmit-and-receive isolation characteristics can be improved while substantially maintaining the transmission characteristics of the receive band.

In the transmit-and-receive module 1 including the low-noise amplifier 30 having the above-described impedance characteristics, if the receive impedance is higher than about 110Ω (about 115Ω, for example), the insertion loss and the noise figure in the receive band are increased.

When the transmit impedance is about 50Ω, the receive impedance can be lower than about 115Ω. That is, the receive impedance can be higher than the transmit impedance by a factor smaller than about 2.3.

The present inventors have found that it is possible to enhance the isolation while decreasing the noise figure when the receive impedance is higher than the transmit impedance by a factor smaller than about 2.3, compared with when the receive impedance is equal to the transmit impedance. The present inventors have also found that, when the center point of NF circles of the low-noise amplifier is located on the higher impedance side than that of gain circles is, if the output impedance in the receive band of the receive filter 10R is set to be higher than the input impedance in the transmit band of the transmit filter 10T by a factor of about 2.3 or greater, the gain of the low-noise amplifier is significantly decreased and the noise figure thereof is also increased. When the receive impedance is higher than the transmit impedance by a factor smaller than about 2.3, the receiving noise figure can be decreased substantially without necessarily decreasing the receiving gain.

Second Embodiment

In the first embodiment, a transmit-and-receive module for transmitting and receiving RF signals in a single frequency band has been discussed. In a second embodiment, a transmit-and-receive module for transmitting and receiving RF signals in multiple frequency bands will be discussed.

Figure 11:
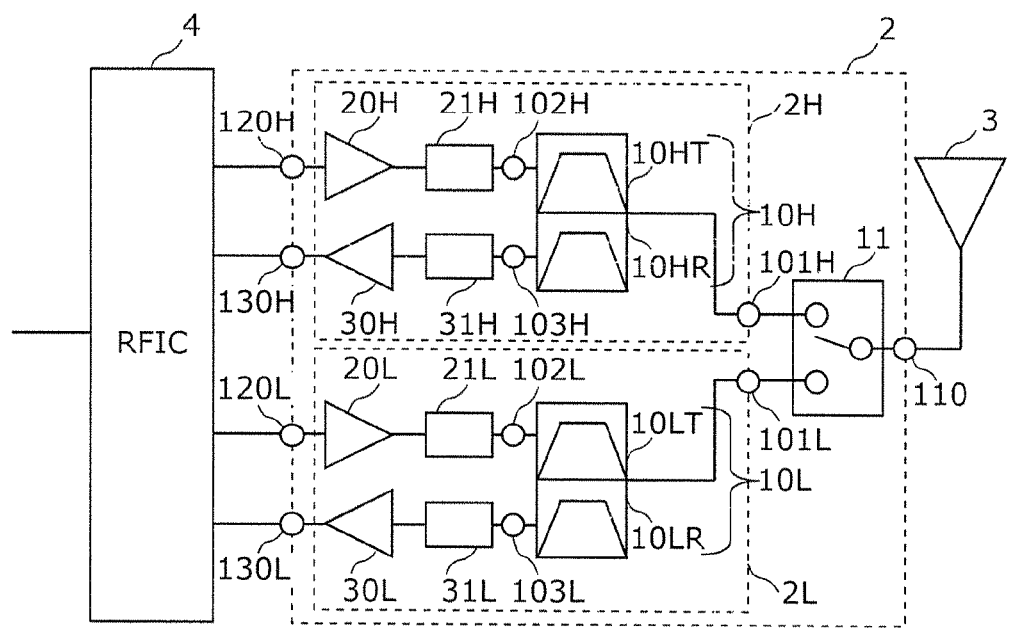
FIG. 11 is a circuit diagram of a communication device and a transmit-and-receive module according to a second embodiment.

FIG. 11 is a circuit diagram of a communication device and a transmit-and-receive module 2 according to the second embodiment. The communication device according to the second embodiment includes the transmit-and-receive module 2 and a RF signal processing circuit 4. The communication device may alternatively include the transmit-and-receive module 1 according to the first embodiment and the RF signal processing circuit 4.

The RF signal processing circuit 4 performs signal processing, such as down-conversion, on a RF received signal received from an antenna 3 via a duplexer and a low-noise amplifier, and outputs the resulting received signal to a baseband signal processing circuit (not shown) subsequent to the RF signal processing circuit 4. The RF signal processing circuit 4 also performs signal processing, such as up-conversion, on a transmit signal received from the baseband signal processing circuit, and outputs the resulting RF transmit signal to a power amplifier. An example of the RF signal processing circuit 4 is a RFIC.

The transmit-and-receive module 2 includes a switch 11, a high-band transmitter-and-receiver 2H, and a low-band transmitter-and-receiver 2L.

In the switch 11, a common terminal is connected to the antenna 3, a first selection terminal is connected to the high-band transmitter-and-receiver 2H, and a second selection terminal is connected to the low-band transmitter-and-receiver 2L. With this configuration, the switch 11 connects the antenna 3 to the high-band transmitter-and-receiver 2H or the low-band transmitter-and-receiver 2L. Alternatively, the switch 11 may have a function of simultaneously connecting the antenna 3 to the high-band transmitter-and-receiver 2H and the low-band transmitter-and-receiver 2L.

The high-band transmitter-and-receiver 2H includes a duplexer 10H, a power amplifier (PA) 20H, a low-noise amplifier (LNA) 30H, a matching circuit 21H, an adjusting circuit 31H, a module transmit terminal 120H, and a module receive terminal 130H. The duplexer 10H includes a common terminal 101H, a transmit terminal 102H, a receive terminal 103H, a transmit filter 10HT, and a receive filter 10HR. The transmit filter 10HT is a transmit filter unit using a first transmit band as a pass band and being connected to the common terminal 101H and the transmit terminal 102H. The receive filter 10HR is a receive filter unit using a first receive band as a pass band and being connected to the common terminal 101H and the receive terminal 103H.

The high-band transmitter-and-receiver 2H is the transmit-and-receive module 1 according to the first embodiment, for example.

To reduce the size of the high-band transmitter-and-receiver 2H, the power amplifier 20H handling high-power signals and the low-noise amplifier 30H handling low-power signals are integrated with each other. In a Smith chart, the output impedance of the receive filter 10HR is set so that the impedance in the receive band of the receive filter 10HR seen from the receive terminal 103H intersects a line connecting the center point of NF circles and that of gain circles.

The low-band transmitter-and-receiver 2L includes a duplexer 10L, a power amplifier (PA) 20L, a low-noise amplifier (LNA) 30L, a matching circuit 21L, an adjusting circuit 31L, a module transmit terminal 120L, and a module receive terminal 130L. The duplexer 10L is a second duplexer including a common terminal 101L (second common terminal), a transmit terminal 102L (second transmit terminal), a receive terminal 103L (second receive terminal), a transmit filter 10LT, and a receive filter 10LR.

The transmit filter 10LT is a second transmit filter unit using a second transmit band which is lower than the first transmit band as a pass band and being connected to the common terminal 101L and the transmit terminal 102L. The receive filter 10LR is a second receive filter unit using a second receive band which is lower than the first receive band as a pass band and being connected to the common terminal 101L and the receive terminal 103L.

The power amplifier 20L is a second power amplifier that amplifies a RF transmit signal and outputs the amplified RF transmit signal to the duplexer 10L via the transmit terminal 102L.

The low-noise amplifier 30L is a second low-noise amplifier that amplifies a RF received signal received from the antenna 3 via the receive terminal 103L.

The low-band transmitter-and-receiver 2L is the transmit-and-receive module 1 according to the first embodiment, for example.

To reduce the size of the low-band transmitter-and-receiver 2L, the power amplifier 20L handling high-power signals and the low-noise amplifier 30L handling low-power signals are integrated with each other. In a Smith chart, the output impedance of the receive filter 10LR is set so that the impedance in the receive band of the receive filter 10LR seen from the receive terminal 103L intersects a line connecting the center point of NF circles and that of gain circles.

With the above-described configuration, in a multiband-support front-end circuit, impedance matching between the duplexer 10H and the low-noise amplifier 30H and between the duplexer 10L and the low-noise amplifier 30L disposed in plural signal paths connected to the antenna 3 is performed as follows. Instead of using the characteristic impedance, customized impedance reflecting the impedance characteristics of the low-noise amplifier 30H is used for impedance matching between the duplexer 10H and the low-noise amplifier 30H, and customized impedance reflecting the impedance characteristics of the low-noise amplifier 30L is used for impedance matching between the duplexer 10L and the low-noise amplifier 30L. It is thus possible to provide a transmit-and-receive module which is small in size and which achieves the optimized balance between the receiving noise figure and the receiving gain according to the frequency band while plural duplexers, plural power amplifiers, and plural low-noise amplifiers supporting multiple bands are integrated with each other, and to provide a communication device including the transmit-and-receive module.

In the transmit-and-receive module 2 according to the second embodiment, at least one of the high-band transmitter-and-receiver 2H and the low-band transmitter-and-receiver 2L may have the configuration and the function of the transmit-and-receive module 1 according to the first embodiment. In the transmit-and-receive module 2, three or more frequency bands may be used. That is, three or more signal paths, each of which is constituted by a transmit signal path and a received signal path, may be provided. In this case, at least one of the three or more transmitters-and-receivers has the configuration and the function of the transmit-and-receive module 1 according to the first embodiment.

Third Embodiment

In the first and second embodiments, FDD-support transmit-and-receive module for transmitting and receiving RF signals having different frequencies has been discussed.

Figure 12:
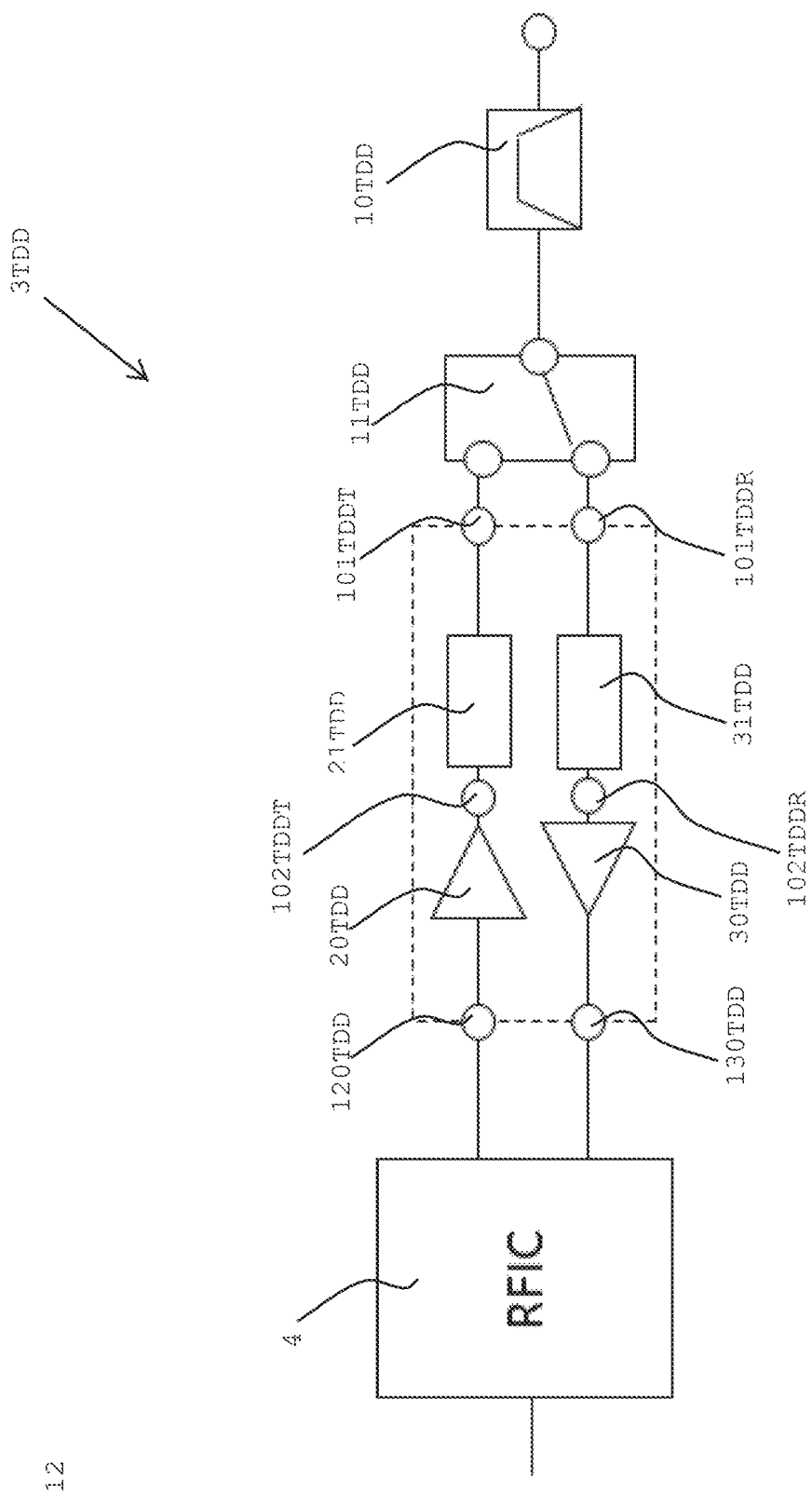
FIG. 12 is a circuit diagram of a communication device and transmit-and-receive module according to a third embodiment.

In a third embodiment, a time-division-duplexing (TDD) transmit-and-receive module for transmitting and receiving RF signals having the same frequencies will be discussed. FIG. 12 is a circuit diagram of a communication device and a transmit-and-receive module 3TDD according to the third embodiment. The communication device and a transmit-and-receive module 3TDD of FIG. 12 is capable of time division duplexing (TDD).

The communication device according to the third embodiment includes a TDD-support switch 11TDD and a TDD-support band-pass filter 10TDD, but does not include the duplexer 10 used in the first and second embodiments.

In the switch 11TDD, a common terminal is connected to the band pass filter 10TDD, a first selection terminal (or transmit terminal) 101TDDT is connected to a matching circuit 21TDD, and a second selection terminal (or receive terminal) 101TDDR is connected to an adjusting circuit 31TDD. The switch 11TDD switches between a transmit path and a receive path in accordance with a switching timing at which a signal is transmitted and a signal is received.

The matching circuit 21TDD is connected to an output terminal 102TDDT of a power amplifier 20TDD. The output impedance of the power amplifier 20TDD seen from the output terminal 102TDDT matches the input impedance of the band-pass filter 10TDD. The output impedance of the power amplifier 20TDD is converted by the matching circuit 21TDD so as to match the input impedance of the band pass filter 10TDD. Likewise, the adjusting circuit 31TDD is connected to an input terminal 102TDDR of a low-noise amplifier 30TDD. The input impedance of the low-noise amplifier 30TDD seen from the input terminal 102TDDR matches the output impedance of the band pass filter 10TDD.

Accordingly, as in the first embodiment, in a Smith chart, the output impedance of the band pass filter 10TDD is set so that the impedance in the receive band of the band pass filter 10TDD seen from the input terminal 102TDDR of the low-noise amplifier 30TDD can intersect a line connecting the center point of the NF circles and that of the gain circles.

With the above-described configuration for a TDD front-end circuit, instead of using a characteristic impedance (about 50Ω, for example), a customized impedance reflecting the impedance characteristics of the low-noise amplifier 30TDD is used for impedance matching between the band-pass filter 10TDD and the low-noise amplifier 30TDD in a received signal path is used for impedance matching between the band pass filter 10TDD and the low-noise amplifier 30TDD. It is thus possible to provide impedance matching between the low-noise amplifier 30TDD and the band-pass filter 10TDD while achieving the optimized balance between the noise figure characteristics and the gain characteristics of the low-noise amplifier 30TDD.

It is thus possible to provide a transmit-and-receive module which achieves the optimized balance between the receiving noise figure and the receiving gain according to the frequency band.

Fourth Embodiment

In the third embodiment, a TDD transmit-and-receive module for transmitting and receiving RF signals having the same frequencies has been discussed.

In a fourth embodiment, a description will be given of the configuration in which a TDD-support transmit-and-receive module and an FDD-support transmit-and-receive module are combined with each other. The points already discussed in the first through third embodiments will not be repeated.

Figure 13:
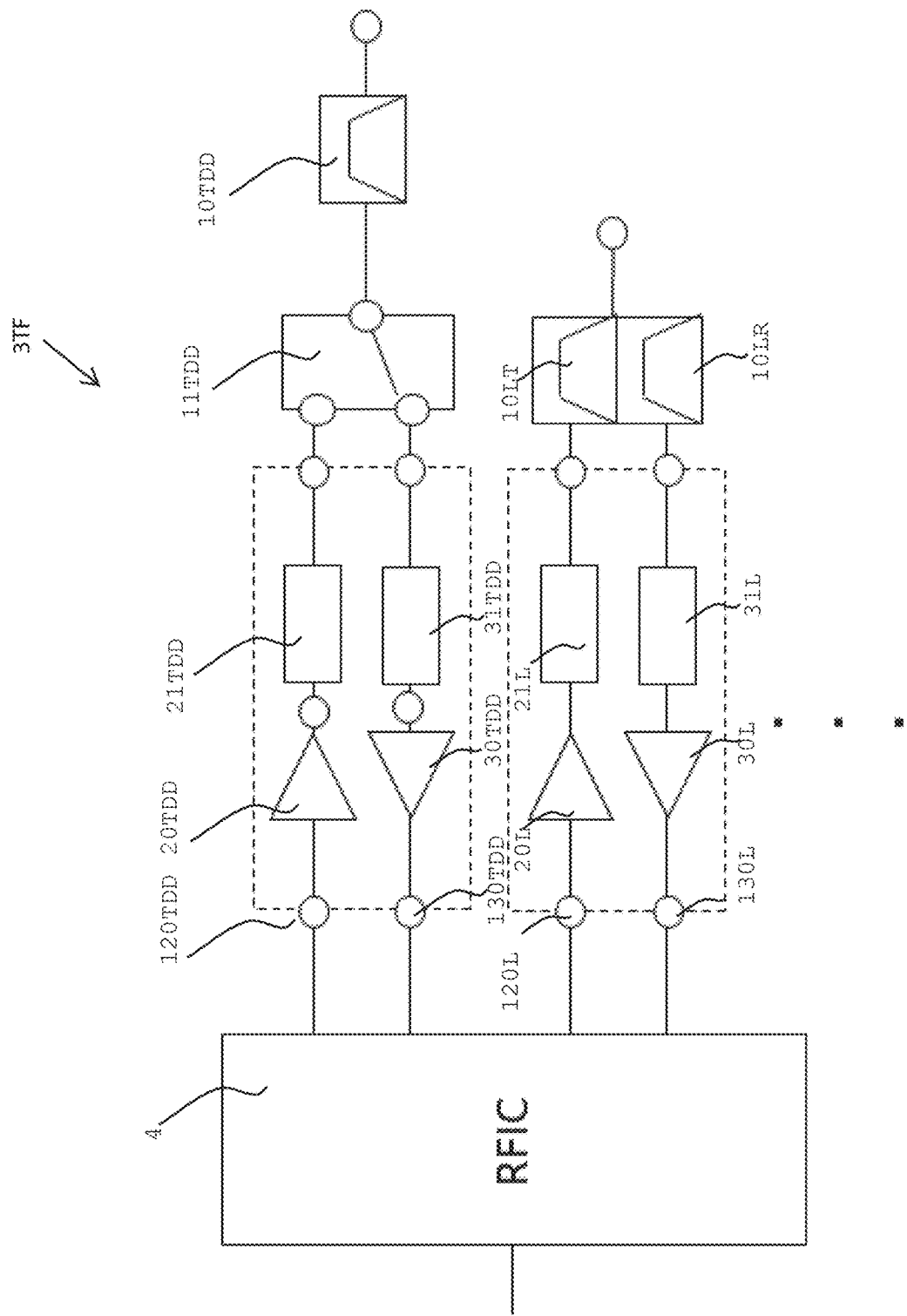
FIG. 13 is a circuit diagram of a communication device and transmit-and receive module according to a fourth embodiment.

FIG. 13 is a circuit diagram of a communication device and a transmit-and-receive module 3TF according to the fourth embodiment, in which the transmit-and-receive module 3TDD is combined with the transmit-and-receive module 1 of the first embodiment.

With the configuration, the characteristic impedance is not used for performing impedance matching of the low-noise amplifier 30TDD. Similarly, in the FDD transmit-and-receive module, the characteristic impedance is not used for performing impedance matching of the low-noise amplifier 30L. Instead of using the characteristic impedance, customized impedance reflecting the impedance characteristics of the low-noise amplifier disposed in each signal path, which intersects a line connecting the center point of the NF circles and that of the gain circles, is used for impedance matching of the low-noise amplifier. It is thus possible to set the output impedance of the band pass filter 10TDD and the receive filter 10LR so that the input impedance of the low-noise amplifiers 30TDD and 30L can be optimized to achieve the balance between the noise figure characteristics and the gain characteristics of the low-noise amplifiers 30TDD and 30L. To achieve the characteristics of each of the low-noise amplifiers 30TDD and 30L, the output impedance of the band pass filter 10TDD and that of the receive filter 10LR may be different from each other or may be the same.

It is thus possible to provide a transmit-and-receive module which achieves the optimized balance between the receiving noise figure and the receiving gain according to the frequency band.

Fifth Embodiment

In the fourth embodiment, the configuration in which a TDD-support transmit-and-receive module and an FDD-support transmit-and-receive module are combined with each other has been discussed. In the configuration of a fifth embodiment, switches 11MUT and 11MUR are added to the transmit-and-receive module 1 of the first embodiment, and a multiplexer 10MU is provided instead of the duplexer 10.

Figure 14:
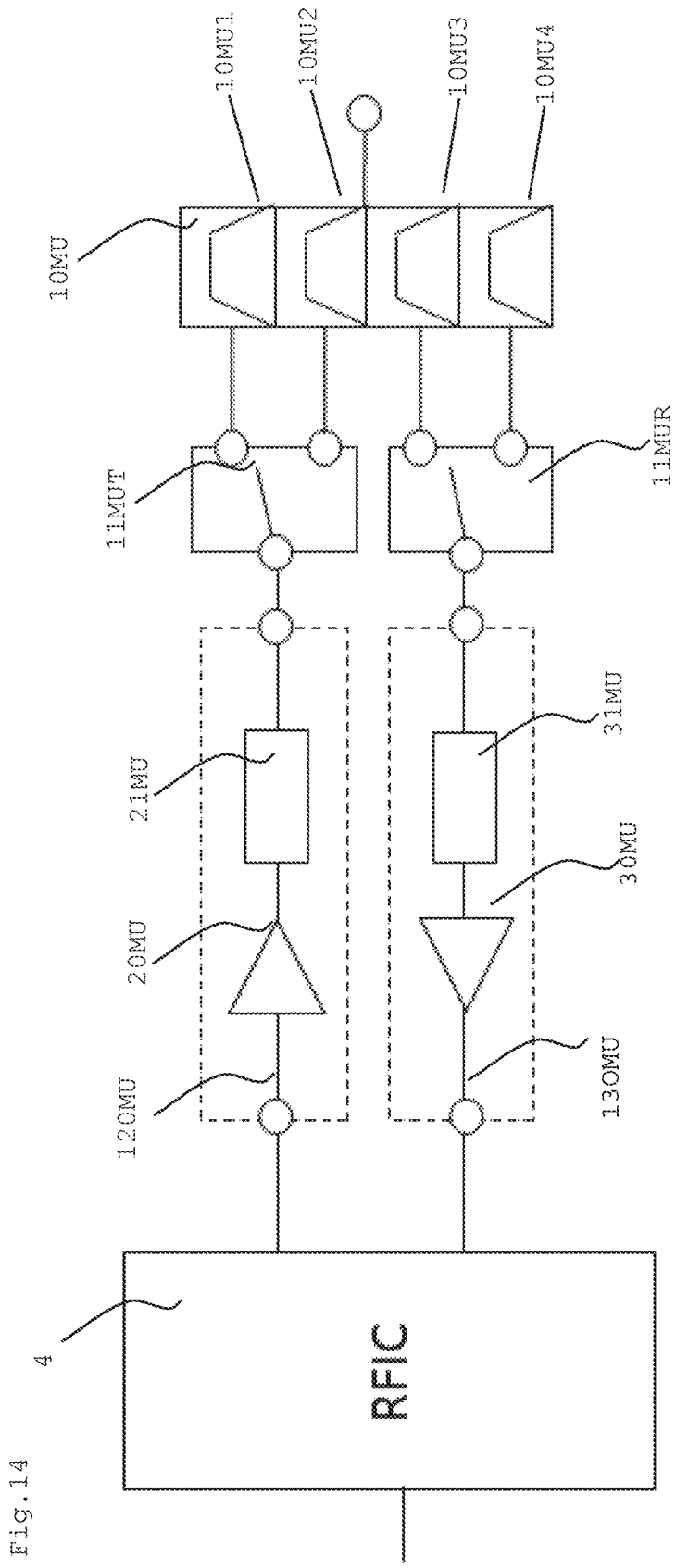
FIG. 14 is a circuit diagram of a communication device and transmit-and receive module according to a fifth embodiment.

In the example in FIG. 14, the multiplexer 10MU is a quadplexer. However, the multiplexer 10MU may be of a size other than a quadplexer, such as a triplexer and an octaplexer. In other words, the multiplexer 10MU is a device including two or more filters.

The multiplexer 10MU includes four filters 10MU1, 10MU2, 10MU3, and 10MU4. The filters 10MU1 and 10MU2 are connected to an output matching circuit 21MU via the switch 11MUT. The filters 10MU3 and 10MU4 are connected to an adjusting circuit 31MU via the switch 11MUR. The output impedance of each of the filters 10MU3 and 10MU4 is set to intersect a line connecting the center point of the NF circles and that of the gain circles of a low-noise amplifier 30MU. The output impedance of the filter 10MU3 and that of the filter 10MU4 may be different from each other or may be the same. As in the first embodiment in which the input impedance of the transmit filter is different from the output impedance of the receive filter, the input impedance of the filters 10MU1 and 10MU2 is different from the output impedance of the filters 10MU3 and 10MU4. In this case, to achieve the characteristics of the low-noise amplifier 30MU, the output impedance of the filter 10MU3 and that of the filter 10MU4 may be different from each other or may be the same.

In contrast to a regular multiplexer in which the impedance of each filter is set to be the characteristic impedance (about 50Ω, for example), in the configuration of the fifth embodiment, the impedance of the filters 10MU1 and 10MU2 is different from that of the filters 10MU3 and 10MU4, thereby achieving high isolation characteristics between the transmit filters and the receive filters. If the impedance of the filter 10MU3 and that of the filter 10MU4 are different from each other, high isolation characteristics between the receive filters are also implemented. Although the switches 11MUT and 11MUR are separately provided in the example in FIG. 14, they may be integrated into one chip or may be formed in one circuit.

In some embodiments, the power amplifier and the low-noise amplifier may be integrated with each other as described above.

(Mounting of Transmit-and-Receive Module)

FIG. 15A and FIG. 15B are schematic views of configurations in which the transmit-and-receive module 1 is mounted on a substrate.

In FIG. 15A, the low-noise amplifier 30, the power amplifier 20, the duplexer 10, the matching circuit 21, and the adjusting circuit 31 are mounted on a front surface of a substrate 1P. The transmit-and-receive module 1 is covered by resin 1R.

In FIG. 15B, the power amplifier 20, the duplexer 10, the matching circuit 21, and the adjusting circuit 31 are mounted on the front surface of the substrate 1P, and the low-noise amplifier 30 is mounted on the back surface of the substrate 1P. Conversely, the low-noise amplifier 30 may be mounted on the front surface of the substrate 1P, and the power amplifier 20 may be mounted on the back surface of the substrate 1P. The transmit-and-receive module 1 is covered by resin 1R.

Other Embodiments

The transmit-and-receive modules and the communication device according to embodiments of the disclosure have been discussed through illustration of the first and second embodiments. However, certain elements in the above-described first and second embodiments may be combined to realize other embodiments, and various modifications apparent to those skilled in the art may be made to the first and second embodiments without necessarily departing from the scope and spirit of the disclosure. Such embodiments and modified examples are also encompassed within the present disclosure. Additionally, various apparatuses integrating the transmit-and-receive module and the communication device described above therein are also encompassed within the present disclosure.

In the first and second embodiments, a transmit-and-receive module and a communication device including a duplexer have been discussed by way of example. The present disclosure is also applicable to a quadplexer and a hexaplexer in which plural duplexers are connected to each other.

The configuration in which the output impedance (receive impedance) of the receive filter 10R is set to be higher than the characteristic impedance and the input impedance (transmit impedance) of the transmit filter 10T is not restricted to a particular configuration. For example, if the receive filter 10R is a surface acoustic wave filter including resonators constituted by plural interdigital transducer (IDT) electrodes, electrode parameters such as the pitch of electrode fingers forming an IDT electrode, the interdigital width of the electrode fingers, the number of pairs of electrode fingers, and the distance between the reflector and the IDT electrode may vary among the IDT electrodes. If the receive filter 10R is constituted by ladder elastic wave resonators, the impedance of the elastic wave resonator located closest to the receive terminal 103 may be set to be higher than that of the other elastic wave resonators. With the above-described configurations, high impedance can effectively be implemented while maintaining filter characteristics of the receive filter 10R.

Instead of setting the output impedance of the receive filter 10R to be higher, the impedance of the adjusting circuit 31 seen from the low-noise amplifier 30 may be adjusted.

In the first embodiment, the receive band is a lower frequency side, and the transmit band is a higher frequency side.

However, a transmit-and-receive module according to an embodiment of the disclosure may be applicable to a configuration in which the receive band is a higher frequency side and the transmit band is a lower frequency side.

In a transmit-and-receive module according to an embodiment of the disclosure, circuit elements, such as an inductor, a capacitor, and a resistor element, may be added between the module common terminal 110 and the module transmit terminal 120 or the module receive terminal 130.

The present disclosure is widely applicable to communication terminals, such as cellular phones, as a high-gain, low-noise, small transmit-and-receive module and a communication device including such a transmit-and-receive module.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A transmit-and-receive module comprising:
a multiplexer comprising a common terminal, a transmit terminal, a receive terminal, at least one transmit filter, and at least one receive filter, wherein:
the multiplexer is configured to receive an amplified radio-frequency transmit signal at the transmit terminal and output the amplified radio-frequency transmit signal from the common terminal, and to receive a radio-frequency receive signal at the common terminal and output the radio-frequency receive signal from the receive terminal, a pass band of the transmit filter is a transmit band of the transmit signal and a pass band of the receive filter is a receive band of the receive signal, and the transmit filter is connected between the common terminal and the transmit terminal, and the receive filter is connected between the common terminal and the receive terminal;

a power amplifier configured to amplify the radio-frequency transmit signal and to output the amplified radio-frequency transmit signal to the transmit terminal; and a low-noise amplifier configured to amplify the radio-frequency receive signal received from the receive terminal, wherein:

the power amplifier and the low-noise amplifier are integrated with each other, as graphed on a Smith chart, an impedance in the receive band of the receive filter as seen from the receive terminal intersects a line connecting a center point of noise figure circles and a center point of gain circles, the center point of the noise figure circles representing the impedance at which a noise figure of the low-noise amplifier is minimized and the center point of the gain circles representing the impedance at which gain of the low-noise amplifier is maximized, the multiplexer further comprises a second transmit terminal, a second receive terminal, a second transmit filter, and a second receive filter, the second transmit filter being connected between the second transmit terminal and the common terminal and the second receive filter being connected between the second receive terminal and the common terminal, and the transmit-and-receive module further comprises a transmit switch configured to selectively connect the transmit terminal or the second transmit terminal to the power amplifier, and a receive switch configured to selectively connect the receive terminal or the second receive terminal to the low-noise amplifier.

2. The transmit-and-receive module according to claim 1, wherein:

as graphed on the Smith chart, an output impedance of the receive filter intersects the line connecting the center point of the noise figure circles and the center point of the gain circles; and an input impedance of the transmit filter has a value that maximizes a gain of the power amplifier.

3. The transmit-and-receive module according to claim 1, further comprising:

a matching circuit connected between the transmit terminal and the power amplifier and configured to match impedance between the transmit filter and the power amplifier; and an adjusting circuit connected between the receive terminal and the low-noise amplifier and configured to adjust impedance between the receive filter and the low-noise amplifier, wherein a value of receive impedance used for impedance adjustment between the receive filter and the low-noise amplifier is different from a value of transmit impedance used for impedance matching between the transmit filter and the power amplifier.

4. The transmit-and-receive module according to claim 3, wherein the value of the receive impedance used for impedance adjustment between the receive filter and the low-noise amplifier is higher than the value of the transmit impedance used for impedance matching between the transmit filter and the power amplifier.

5. The transmit-and-receive module according to claim 3, wherein the value of the receive impedance is at least 1.4 times greater than the value of the transmit impedance.

6. The transmit-and-receive module according claim 3, wherein the value of the receive impedance is less than or equal to 2.3 times greater than the value of the transmit impedance.

7. The transmit-and-receive module according to claim 1, wherein an output impedance of the receive filter is different from an output impedance of the second receive filter.

8. The transmit-and-receive module according to claim 1, wherein an output impedance of the receive filter is the same as an output impedance of the second receive filter.

9. The transmit-and-receive module according to claim 1, wherein an output impedance of the receive filter and an output impedance of the second receive filter are different from an input impedance of the transmit filter.

10. A transmit-and-receive module comprising:

a bandpass filter;

a switch having a common terminal connected to the bandpass filter, a transmit terminal, and a receive terminal, wherein the switch is configured to selectively switch the transmit-and-receive module between a transmit mode and a receive mode;

a matching circuit and a power amplifier connected in series to the transmit terminal; and an adjusting circuit and a low-noise amplifier connected in series to the receive terminal, wherein:

when the transmit-and-receive module is in the transmit mode, the switch is configured to selectively connect the bandpass filter to the transmit terminal, when the transmit-and-receive module is in the receive mode, the switch is configured to selectively connect the bandpass filter to the receive terminal, and as graphed on a Smith chart, an impedance of the bandpass filter as seen from the receive terminal intersects a center point of noise figure circles at which a noise figure of the low-noise amplifier is minimized, and a center point of gain circles at which a gain of the low-noise amplifier is maximized.

11. A transmit-and-receive module comprising:

a bandpass filter;

a switch having a common terminal connected to the bandpass filter, a transmit terminal, and a receive terminal, wherein the switch is configured to selectively switch the transmit-and-receive module between a transmit mode and a receive mode;

a matching circuit and a power amplifier connected in series to the transmit terminal; and an adjusting circuit and a low-noise amplifier connected in series to the receive terminal, the adjusting circuit being connected to an input terminal of the low-noise amplifier, wherein:

when the transmit-and-receive module is in the transmit mode, the switch is configured to selectively connect the bandpass filter to the transmit terminal, when the transmit-and-receive module is in the receive mode, the switch is configured to selectively connect the bandpass filter to the receive terminal, and as graphed on a Smith chart, an impedance of the bandpass filter as seen from the input terminal of the low-noise amplifier intersects a center point of noise figure circles at which a noise figure of the low-noise amplifier is minimized, and a center point of gain circles at which a gain of the low-noise amplifier is maximized.

* * * * *